US007425512B2

(12) United States Patent
Udayakumar et al.

(10) Patent No.: US 7,425,512 B2
(45) Date of Patent: Sep. 16, 2008

(54) METHOD FOR ETCHING A SUBSTRATE AND A DEVICE FORMED USING THE METHOD

(75) Inventors: Kezhakkedath R. Udayakumar, Dallas, TX (US); Ted S. Moise, Dallas, TX (US); Scott R. Summerfelt, Garland, TX (US); Martin G. Albrecht, McKinney, TX (US); William W. Dostalik, Jr., Plano, TX (US); Francis G. Celii, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 559 days.

(21) Appl. No.: 10/721,932

(22) Filed: Nov. 25, 2003

(65) Prior Publication Data

US 2005/0112898 A1    May 26, 2005

(51) Int. Cl.
*H01L 21/302* (2006.01)
(52) U.S. Cl. .................. 438/740; 438/706; 438/710; 438/714; 438/738
(58) Field of Classification Search ............... 438/706, 438/710, 712, 714, 738, 740; 216/67
See application file for complete search history.

(56) References Cited

U.S. PATENT DOCUMENTS

| 5,324,683 | A | * | 6/1994 | Fitch et al. ............... 438/422 |
| 5,897,713 | A | * | 4/1999 | Tomioka et al. ........... 118/723 I |
| 6,162,583 | A | * | 12/2000 | Yang et al. ................ 430/313 |
| 6,500,763 | B2 | * | 12/2002 | Kim et al. ................. 438/689 |
| 6,555,896 | B2 |   | 4/2003 | Cathey et al. |
| 6,611,014 | B1 |   | 8/2003 | Kanaya et al. |
| 6,635,185 | B2 | * | 10/2003 | Demmin et al. ............ 216/64 |
| 6,686,293 | B2 | * | 2/2004 | Kim et al. ................. 438/711 |
| 6,713,310 | B2 | * | 3/2004 | Song et al. ................. 438/3 |
| 2002/0142610 | A1 | * | 10/2002 | Chien et al. ............... 438/710 |
| 2003/0127422 | A1 | * | 7/2003 | Tsuchiya .................... 216/2 |

* cited by examiner

*Primary Examiner*—Lan Vinh
(74) *Attorney, Agent, or Firm*—Wade J. Brady, III; Frederick J. Telecky, Jr.

(57) ABSTRACT

The present invention provides a method for etching a substrate, a method for forming an integrated circuit, an integrated circuit formed using the method, and an integrated circuit. The method for etching a substrate includes, among other steps, providing a substrate 140 having an aluminum oxide etch stop layer 130 located thereunder, and then etching an opening 150, 155, in the substrate 140 using an etchant comprising carbon oxide, a fluorocarbon, an etch rate modulator, and an inert carrier gas, wherein a flow rate of the carbon oxide is greater than about 80 sccm and the etchant is selective to the aluminum oxide etch stop layer 130. The aluminum oxide etch stop layer may also be used in the back-end of advanced CMOS processes as a via etch stop layer.

20 Claims, 8 Drawing Sheets

METHOD FOR ETCHING A SUBSTRATE AND A DEVICE FORMED USING THE METHOD

TECHNICAL FIELD OF THE INVENTION

The present invention is directed, in general, to etching and, more specifically, to a method for etching a substrate using a specific etchant recipe.

BACKGROUND OF THE INVENTION

Integrated circuits are mass produced by fabricating hundreds of identical circuit patterns on a single semiconductor wafer. One of the many different processes repeated over and over in manufacturing these integrated circuits is that of using a mask and etchant for forming a particular feature. In such a mask and etching process, a photo mask containing the pattern of the structure to be fabricated is created, then, after formation of a material layer within which the feature is to be formed, the material layer is coated with a light-sensitive material called photoresist or resist. The resist-coated material layer is then exposed to ultraviolet light through the mask, thereby transferring the pattern from the mask to the resist. The wafer is then etched to remove the material layer unprotected by the resist, and then the remaining resist is stripped. This masking process permits specific areas of the material layer to be formed to meet the desired device design requirements.

In the etching process described above, it is important that the etching selectively remove the unwanted material and that the material underlying the material layer is not excessively damaged. A common way to accomplish this is to deposit or otherwise form an etch stop layer on the wafer prior to formation of the material layer. Such etch stop layers are commonly made of a material that is resistant to the particular etching process used.

In the integrated circuit fabrication art, the property of being resistant to an etching process is called the "selectivity" of a material. The selectivity of a particular material in a particular etching process is usually defined as the etching rate of the material to be removed divided by the etching rate of the particular material. Thus, a material that is highly resistant to an etch is said to have a high selectivity.

One of the most effective, and thus common etch stop layers currently used in the fabrication of integrated circuits is silicon nitride (SiN). Unfortunately, using SiN as the etch stop layers introduces unwanted hydrogen into the features of the integrated circuits. Hydrogen is unwanted for a number of reasons. First, the unwanted hydrogen has a negative impact on the transistors, often affecting their gate oxide integrity (GOI) value, antenna gate leakage value, threshold voltage drift value, negative bias temperature instability (NBTI) value, etc. Second, when used in conjunction with ferroelectric memory cells, the unwanted hydrogen introduced by the SiN is often catastrophic. For this reason, a barrier layer is typically introduced between the ferroelectric memory cell and the SiN etch stop. Regrettably, the barrier layer provides an additional step to the already complicated manufacturing process.

Accordingly, what is needed in the art is an etch stop that does not experience, or in another aspect introduce, the problems that arise with the use of the prior art etch stops.

SUMMARY OF THE INVENTION

To address the above-discussed deficiencies of the prior art, the present invention provides a method for etching a substrate, a method for forming an integrated circuit and an integrated circuit formed using the method. The method for etching a substrate includes, among other steps, providing a substrate having an aluminum oxide etch stop layer located thereunder, and then etching an opening in the substrate using an etchant comprising a carbon oxide, a fluorocarbon, an etch rate modulator, and an inert carrier gas, wherein a flow rate of the carbon oxide is greater than about 80 sccm and the etchant is selective to the aluminum oxide etch stop layer.

As indicated above, the present invention further provides a method for forming an integrated circuit. The method for forming the integrated circuit may include providing semiconductor devices over a semiconductor substrate and providing a dielectric layer over the semiconductor devices, the dielectric layer having an aluminum oxide etch stop layer located thereunder. The method may further include etching openings in the dielectric layer using an etchant comprising a carbon oxide, a fluorocarbon, an etch rate modulator, and an inert carrier gas, wherein a flow rate of the carbon oxide is greater than about 80 sccm and the etchant is selective to the aluminum oxide etch stop layer, and contacting the semiconductor devices through the openings.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
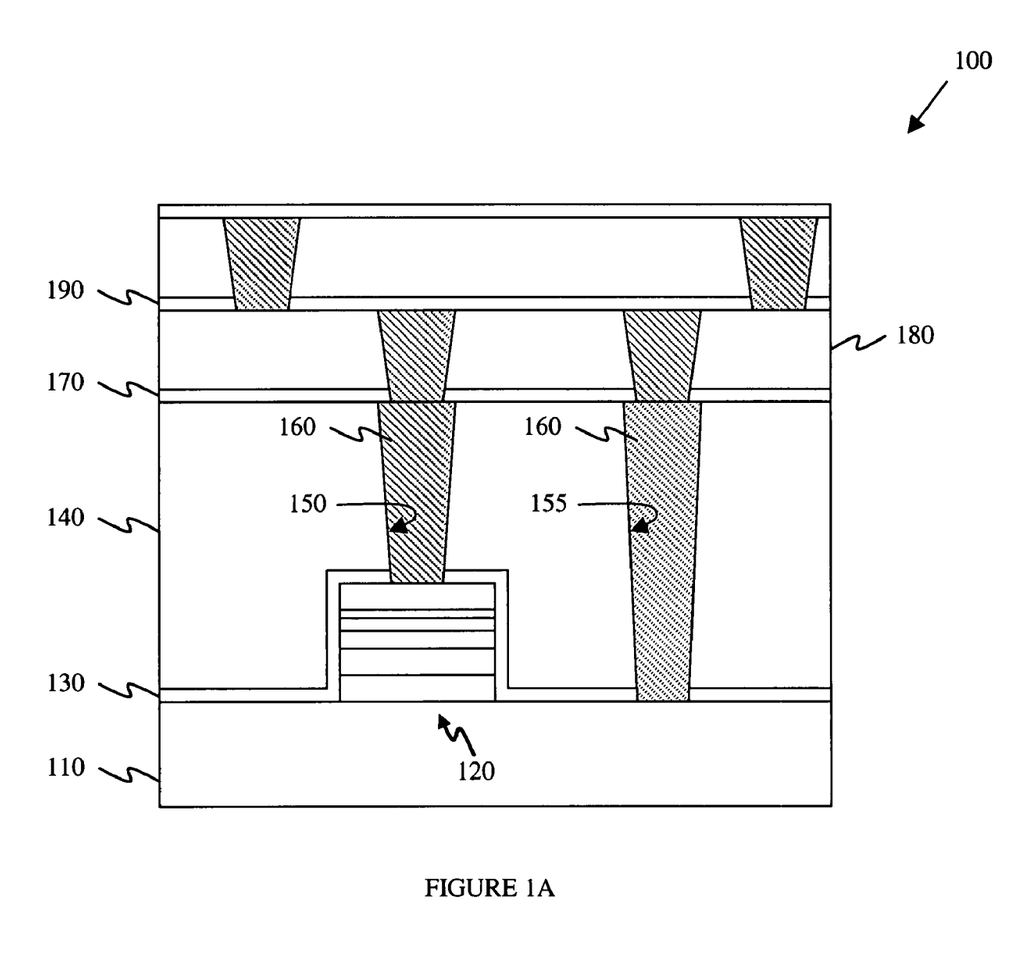
FIG. 1A illustrates a cross-sectional view of a semiconductor device manufactured according to the principles of the present invention.

Referring initially to FIG. 1A illustrated is a cross-sectional view of a semiconductor device 100 manufactured according to the principles of the present invention. The semiconductor device 100 of the embodiment of FIG. 1A includes a ferroelectric capacitor 120 formed over a substrate 110. Located over the ferroelectric capacitor 120 is an aluminum oxide etch stop layer 130. In the exemplary embodiment of FIG. 1A, the aluminum oxide etch stop layer 130 is also located over and in contact with the substrate 110. While the aluminum oxide etch stop layer 130 is labeled as an etch stop layer, uniquely, it also acts as a diffusion barrier layer protecting the ferroelectric capacitor 120 from unwanted contaminants. Thus, the aluminum oxide etch stop layer 130 ultimately functions as a dual purpose etch stop/barrier layer.

Located over the aluminum oxide etch stop layer 130 and ferroelectric capacitor 120 is a dielectric layer 140, such as an interlevel dielectric layer. Located within the dielectric layer 140 are openings 150, 155, such as contact holes, vias, trenches, etc. The openings 150, 155, in accordance with the principles of the present invention, were formed using an etchant comprising a carbon oxide, a fluorocarbon, an etch rate modulator, and an inert carrier gas, wherein a flow rate of the carbon oxide is greater than about 80 sccm, and exemplary greater than about 125 sccm. The aforementioned etchant recipe allows the etchant to be selective to the aluminum oxide etch stop layer 130, while easily etching the openings 150, 155, in the dielectric layer 140. This is particularly useful as the openings 150, 155, are generally simultaneously formed, and the opening 155 must etch deeper than the opening 150 without the opening 150 overetching into the ferroelectric capacitor 120. The combination of the aluminum oxide etch stop layer 130 and the specific etchant recipe allows this stair-stepped multiple trench structure, as shown in FIG. 1A, to be easily formed.

Figure 1B:
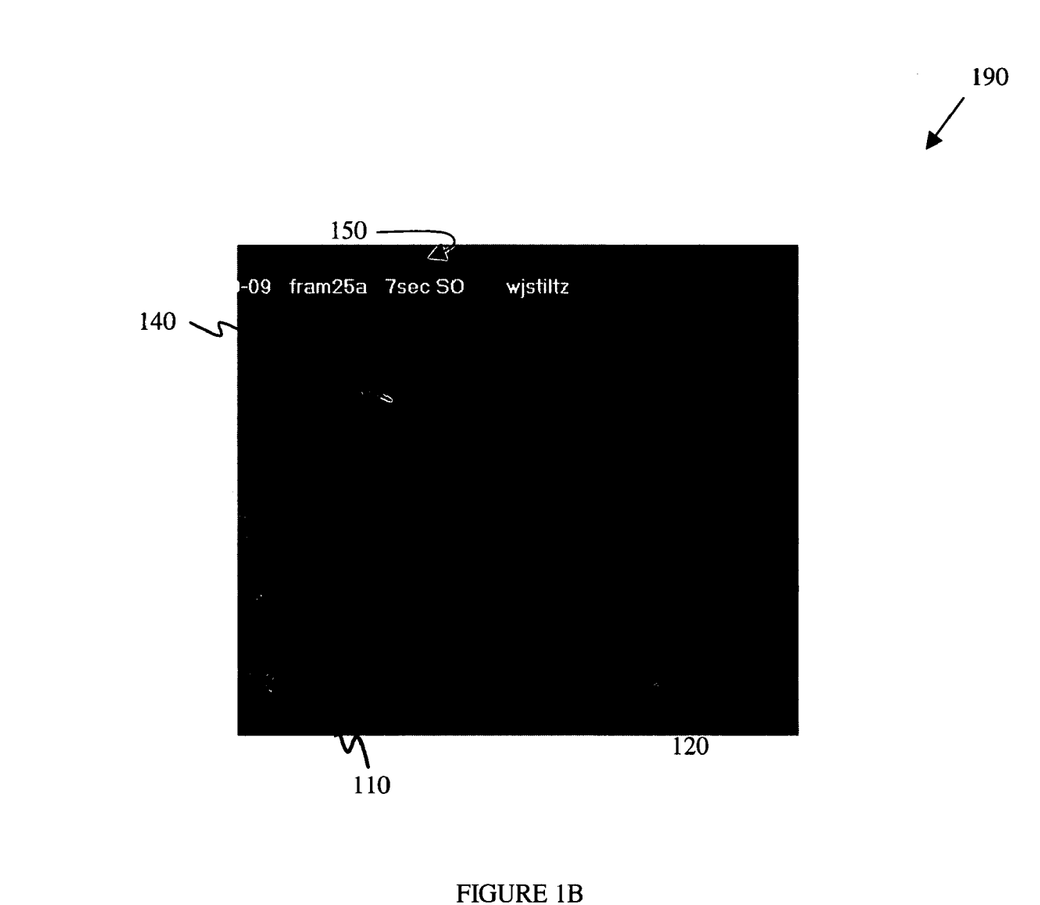
FIG. 1B illustrates an SEM image of a device similar to the semiconductor device illustrated in FIG. 1A.

Turning briefly to FIG. 1B, illustrated is an SEM image 190 of a device similar to the semiconductor device 100 illustrated in FIG. 1A. As illustrated in the SEM image 190, the etching of the opening 150 terminates at the aluminum oxide etch stop layer 130 without substantially overetching into the ferroelectric capacitor 120. Prior to the present invention, such a selectivity was not generally attainable without the use of a silicon nitride (SiN) etch stop layer, which as previously indicated, introduces unwanted hydrogen into the manufacturing process.

Returning to the embodiment of FIG. 1A, located within the openings 150, 155, are conductive plugs 160. Optionally located over the dielectric layer 140 is a diffusion barrier layer 170. The diffusion barrier layer 170, which may comprise aluminum oxide or another similar barrier material, attempts to prevent the migration of unwanted contaminants within the semiconductor device 100. Located over the diffusion barrier layer 170 is another dielectric layer 180 and another optional diffusion barrier layer 190. The additional dielectric layer 180 and additional optional diffusion barrier layer 190 may comprise similar materials to the dielectric layer 140 and optional diffusion barrier layer 170, respectively.

While not shown, those skilled in the art understand that the diffusion barrier layers 170, 190, alone or in combination could be used in a conventional CMOS process, for example without the ferroelectric capacitor 120 located therein. As the diffusion barrier layers 170, 190, may comprise aluminum oxide, and may function as etch stop layers, they do not introduce the unwanted hydrogen into the manufacturing process as conventional silicon nitride etch stop layers might. Accordingly, in an alternative embodiment of the present invention, all the silicon nitride etch stop layers conventionally used within the aforementioned conventional CMOS process might be replaced with aluminum oxide diffusion barrier layers. Those aluminum oxide diffusion barrier layers, therefore, could be located in the back-end of the manufacturing process where hydrogen is commonly introduced. Therefore, the aluminum oxide diffusion barrier layers might be used for diffusion prevention purposes, as well as eliminating the hydrogen typically introduced by the conventional silicon nitride etch stop layer manufacturing processes.

Figure 2:
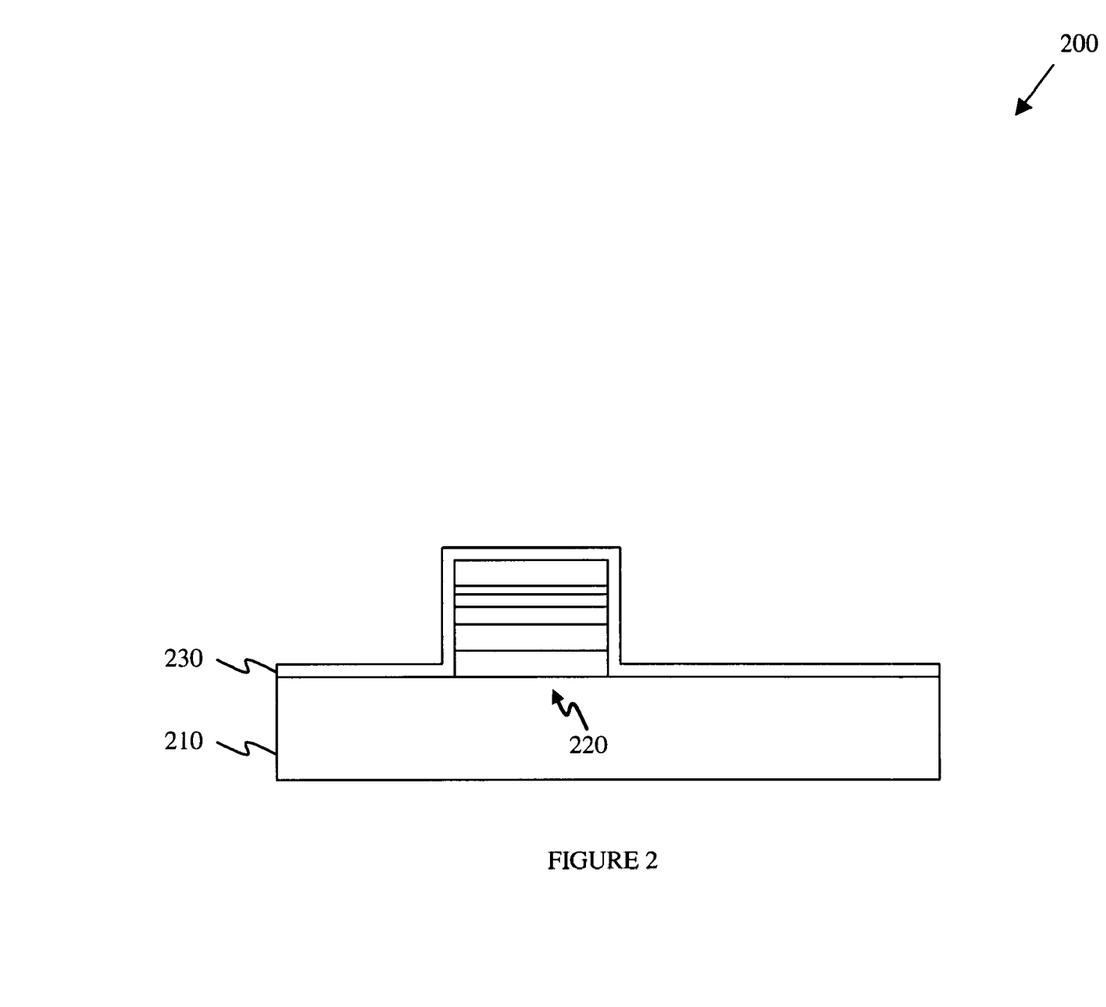
FIG. 2 illustrates a cross-sectional view of a partially completed semiconductor device.

Turning now to FIGS. 2-5, illustrated are cross-sectional views of detailed manufacturing steps instructing how one might, in an advantageous embodiment, manufacture a semiconductor device similar to the semiconductor device 100 depicted in FIG. 1A. FIG. 2 illustrates a cross-sectional view of a partially completed semiconductor device 200. The partially completed semiconductor device 200 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a dielectric layer, such as an interlevel dielectric layer.

Located over the substrate 210 in the embodiment depicted in FIG. 2 is a microelectronic device 220. While the microelectronic device 200 shown in FIG. 2 happens to be a ferroelectric capacitor, those skilled in the art understand that a number of different types of devices could be substituted for the ferroelectric capacitor and stay within the scope of the present invention. Nonetheless, the microelectronic device 200 will be illustrated as a ferroelectric capacitor for the remaining portion of this document.

Furthermore, formed over the microelectronic device 220 and portions of the substrate 210 is an aluminum oxide etch stop layer 230. The aluminum oxide etch stop layer 230 may have a number of different stoichiometric compositions as represented by the equation $AlO_x$. Nonetheless, a stoichiometric composition where x ranges from about 1 to about 2 is most common.

In the embodiment of FIGS. 2-5, the aluminum oxide etch stop layer 230 has a thickness of greater than about 40 nm, and particularly a thickness ranging from about 40 nm to about 100 nm. This thickness, however, is often dependent on the amount of protection the device thereunder requires in view of the etching process. While the aluminum oxide etch stop layer 230 may be formed using a number of different well-known processes, it has been observed that an atomic layer deposition (ALD) process provides the robustness required for many applications of the present invention.

Figure 3:
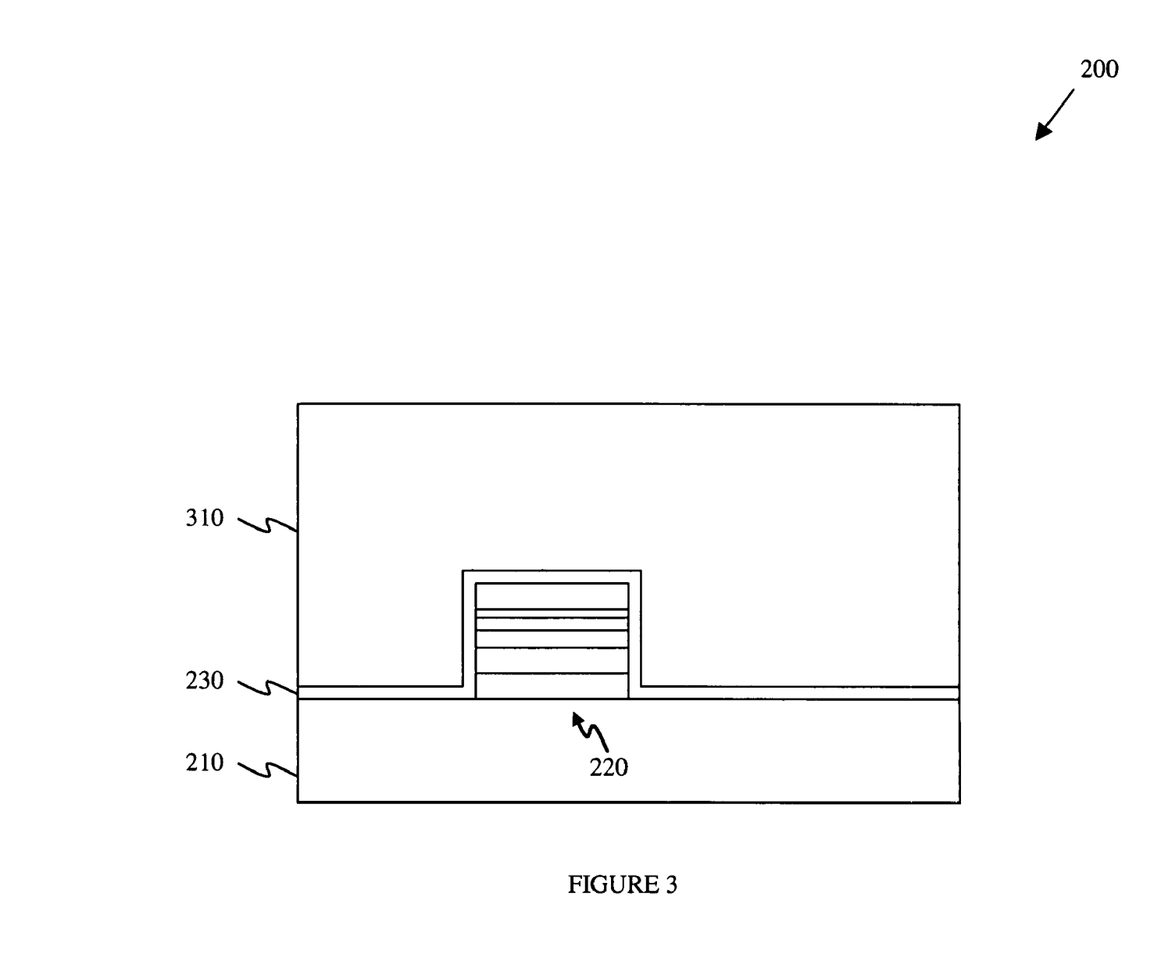
FIG. 3 illustrates a cross-sectional view of the partially completed semiconductor device illustrated in FIG. 2 after conventionally forming a dielectric layer over the microelectronic device and aluminum oxide etch stop layer.

Turning now to FIG. 3, illustrated is a cross-sectional view of the partially completed semiconductor device 200 illustrated in FIG. 2 after conventionally forming a dielectric layer 310 over the microelectronic device 220 and aluminum oxide etch stop layer 230. The dielectric layer 310, which most likely represents an interlevel dielectric layer, may comprise a variety of different materials while staying within the scope of the present invention. For instance, any known or hereafter discovered dielectric material, including silicon dioxide, could be used for the dielectric layer 310. As those skilled in the art are well aware, the particular manufacturing process and parameters of the dielectric layer 310 will vary according to its intended use.

Figure 4:
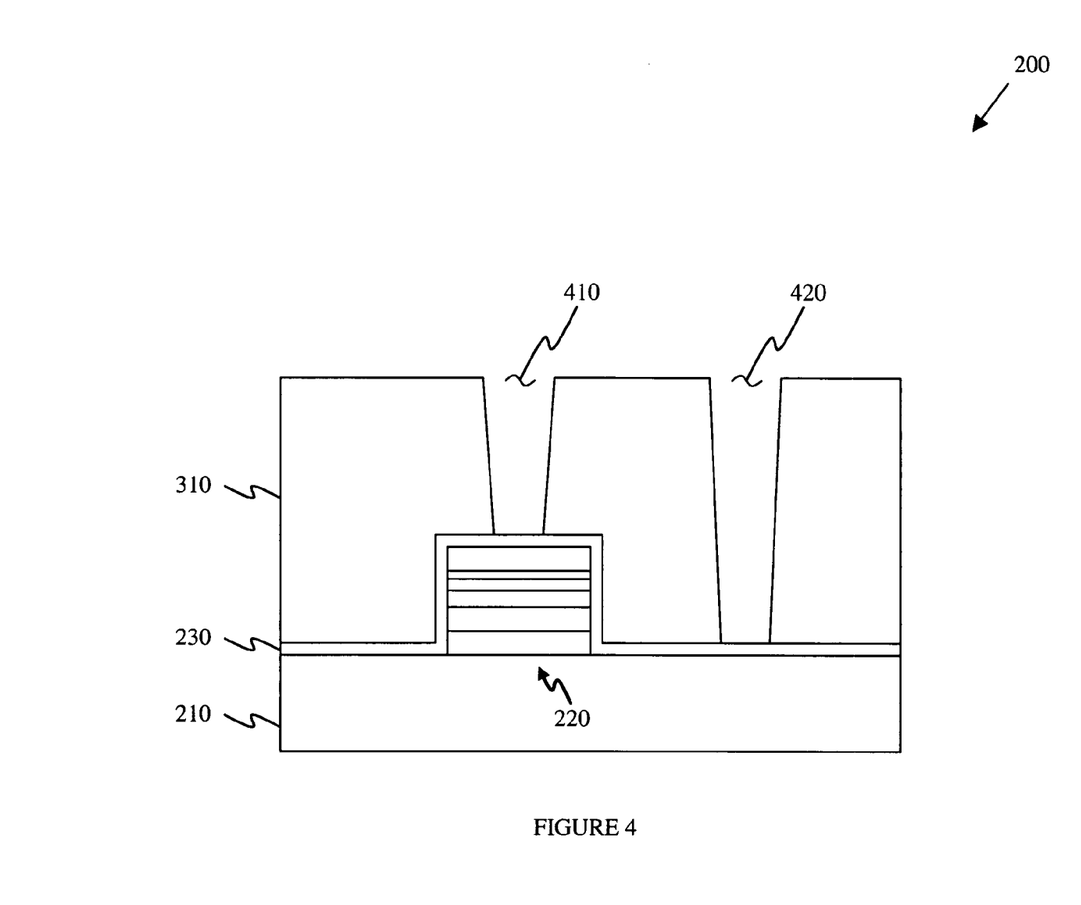
FIG. 4 illustrates a cross-sectional view of the partially completed semiconductor device illustrated in FIG. 3 after etching openings within the dielectric layer.

Turning now to FIG. 4, illustrated is a cross-sectional view of the partially completed semiconductor device 200 illustrated in FIG. 3 after etching openings 410, 420, within the dielectric layer 310. As is indicated in the embodiment of FIG. 4, the openings 410, 420, are formed having different depths, and each terminate on the aluminum oxide etch stop layer 230. In practice, the etchant may penetrate the aluminum oxide etch stop layer 230 a small amount. Thus, when it is stated that the etch stops "on" the aluminum oxide etch stop layer 230, the word "on" includes both the case where the etch goes to the aluminum oxide etch stop layer 230 and stops and the case where it also to some degree etches the aluminum oxide etch stop layer 230 and stops in the aluminum oxide etch stop layer 230. Nevertheless, without the aluminum oxide etch stop layer 230, in combination with the specialized etchant recipe used to etch the openings 410, 420, the opening 410 would overetch into the microelectronic device 220 as the opening 420 continues to etch to the surface of the substrate 210. If this overetching were to occur within the opening 410, it could severely harm, or possibly destroy, the microelectronic device 220 located thereunder.

The etchant recipe used to etch the openings 410, 420, is substantially different from conventional etchant recipes. For example, the etchant recipe used to etch the openings 410, 420, comprises a carbon oxide, a fluorocarbon, an etch rate modulator, and an inert carrier gas, wherein a flow rate of the carbon oxide is greater than about 80 sccm, and exemplary greater than about 125 sccm. This specific flow rate, in combination with other tailored factors, allows the etchant to stop on the aluminum oxide etch stop layer 230 without overetching into the microelectronic device 220. In one instance, it has been observed that setting the flow rate for the carbon oxide, such as carbon monoxide, to range from about 150 sccm to about 220 sccm provides superior results.

Depending on the specific type of dielectric layer 310 being etched, the composition for each of the carbon oxide, fluorocarbon, etch rate modulator, and inert carrier gas may change. For example, it is believed that the carbon oxide may be either CO or $CO_2$. Additionally, while many fluorocarbons may be used, it is believed that $C_4F_8$ or $C_5F_8$ provide particularly beneficial results. Other fluorocarbons that might be used, however, include without limitation, $C_4F_6$, $C_2F_6$, $CF_4$, $NF_3$, $XeF_2$, $F_2$, $CHF_3$, $CH_2F_2$, $CH_3F$, $SF_6$, or any combination thereof.

The etch rate modulator, among other compositions, may comprise $O_2$ or $N_2$. For example, if the dielectric layer 310 comprises OSG, then $O_2$ cannot be used as the etch rate modulator. Unfortunately, the $O_2$ tends to leach the carbon from the OSG dielectric layer. Thus, in this instance $N_2$ might be used. In those instances where $O_2$ is used, however, a ratio of the fluorocarbon to the etch rate modulator, in a preferred embodiment, should be at least 2:1. Preferably the ratio would range from about 2:1 to about 3:1, and a flow rate of the fluorocarbon might range from about 12 sccm to about 18 sccm and the flow rate of the etch rate modulator might range from about 4 sccm to about 8 sccm.

While the specific composition of the etchant may be tailored to stop on the aluminum oxide etch stop layer 230, the time for etching, pressure used during etching and power used for etching may also be tailored. For instance, a pressure ranging from about 50 mT to about 150 mT might be used, as well as a power ranging from about 1000 W to about 1500 W might also be used.

That said, a number of specific etch processes and chemistries have been performed that show high selectivity, in that the etchant stops on the aluminum oxide etch stop layer 230. While many other processes and chemistries exist within the scope of the present invention, a first etchant recipe consisting of 200 CO, 16 $C_5F_8$, 6 $O_2$ and 500 Ar conducted for 90 seconds at 60 mT and 1300 W performed quite well. Additionally, an etchant recipe consisting of 175 CO, 8 $C_5F_8$, 150 $N_2$ and 800 Ar conducted for 100 s at 100 mT and 1300 W also performed quite well.

Figure 5:
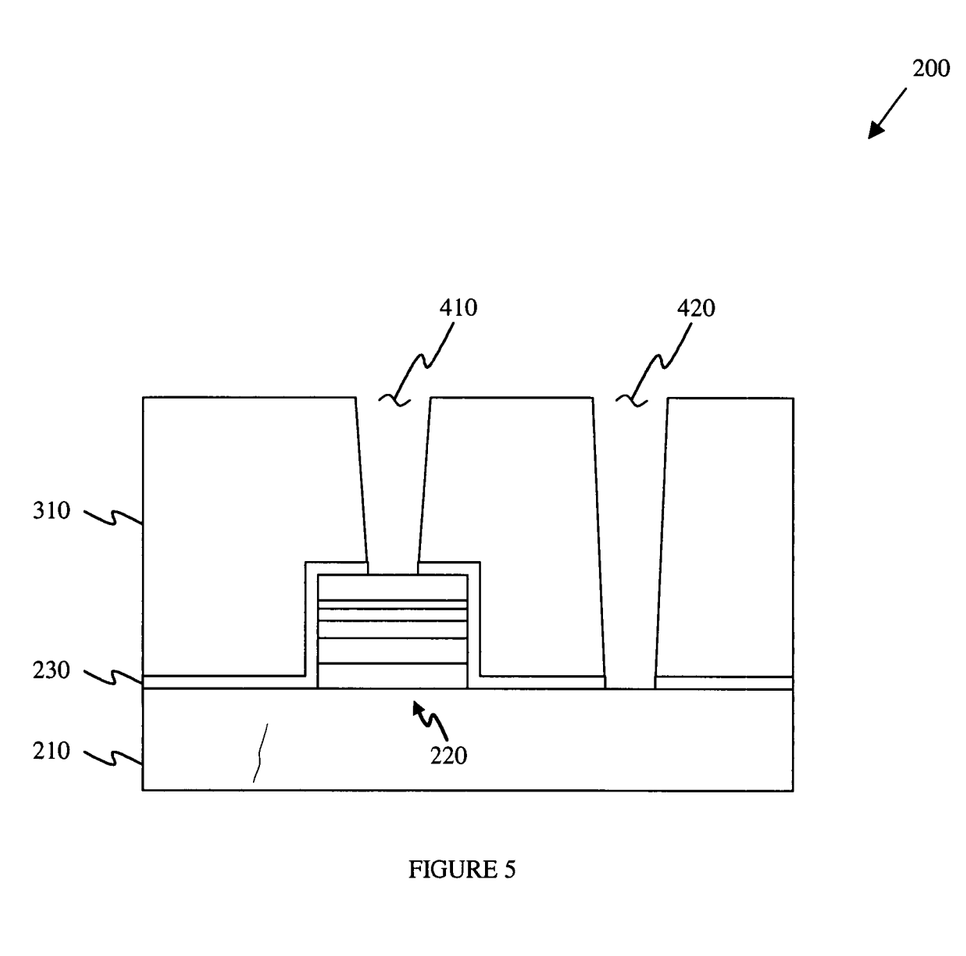
FIG. 5 illustrates a cross-sectional view of the partially completed semiconductor device illustrated in FIG. 4 after conventional removal of the remaining aluminum oxide etch stop layer within the openings.

Turning now to FIG. 5 illustrated is a cross-sectional view of the partially completed semiconductor device 200 illustrated in FIG. 4 after conventional removal of the remaining aluminum oxide etch stop layer 230 within the openings 410, 420. Those skilled in the art understand the conventional process that might be used to remove the remaining portions of the aluminum oxide etch stop layer 230 within the openings 410, 420, including changing the etchant recipe to a conventional oxide etch recipe.

Figure 6:
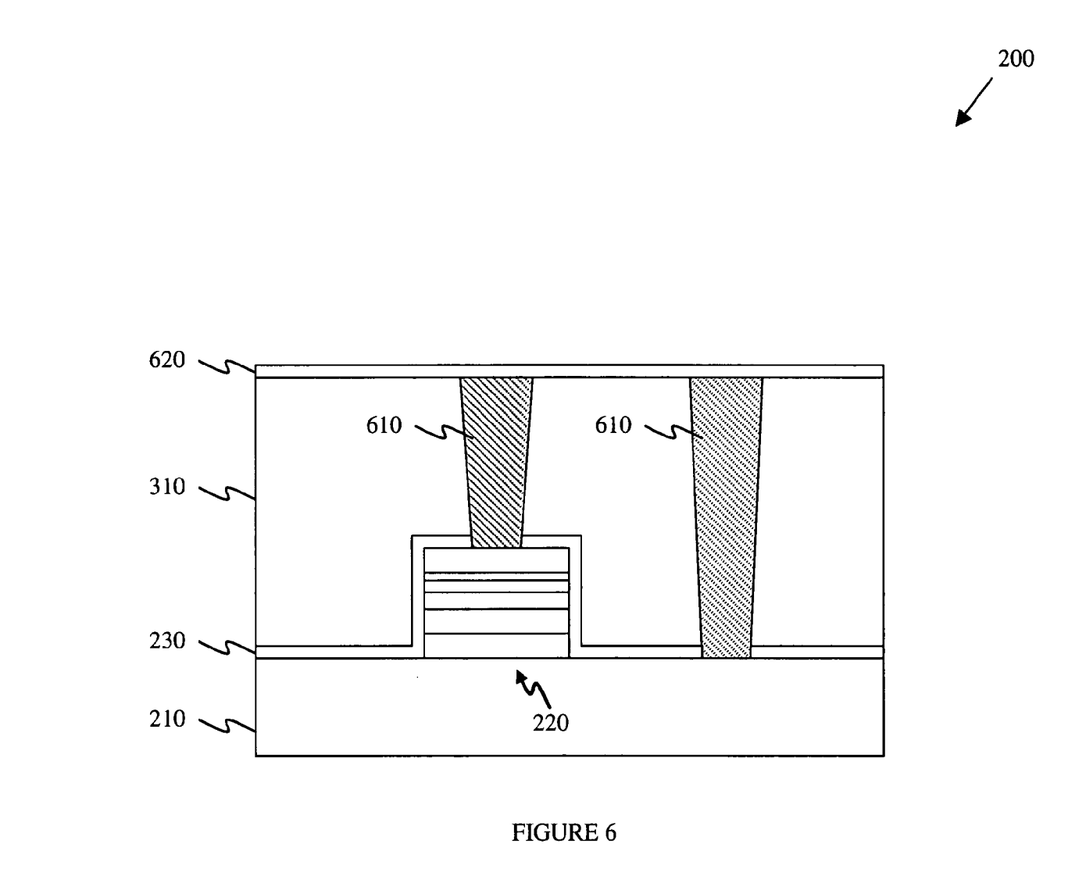
FIG. 6 illustrates a cross-sectional view of the partially completed semiconductor device illustrated in FIG. 5 after conventionally forming conductive plugs within the openings.

Turning now to FIG. 6 illustrated is a cross-sectional view of the partially completed semiconductor device 200 illustrated in FIG. 5 after conventionally forming conductive plugs 610 within the openings 410, 420. After the conventional formation of the conductive plugs 610 an optional diffusion barrier layer 620 may be formed over the dielectric layer 310. The diffusion barrier layer 620, which may also comprise aluminum oxide, attempts to reduce the movement of unwanted contaminants within the partially completed semiconductor device 200 illustrated in FIG. 6. After forming the optional diffusion barrier layer 620 the manufacturing process would continue resulting in a completed semiconductor device, similar to the semiconductor device 100 illustrated in FIG. 1.

Figure 7:
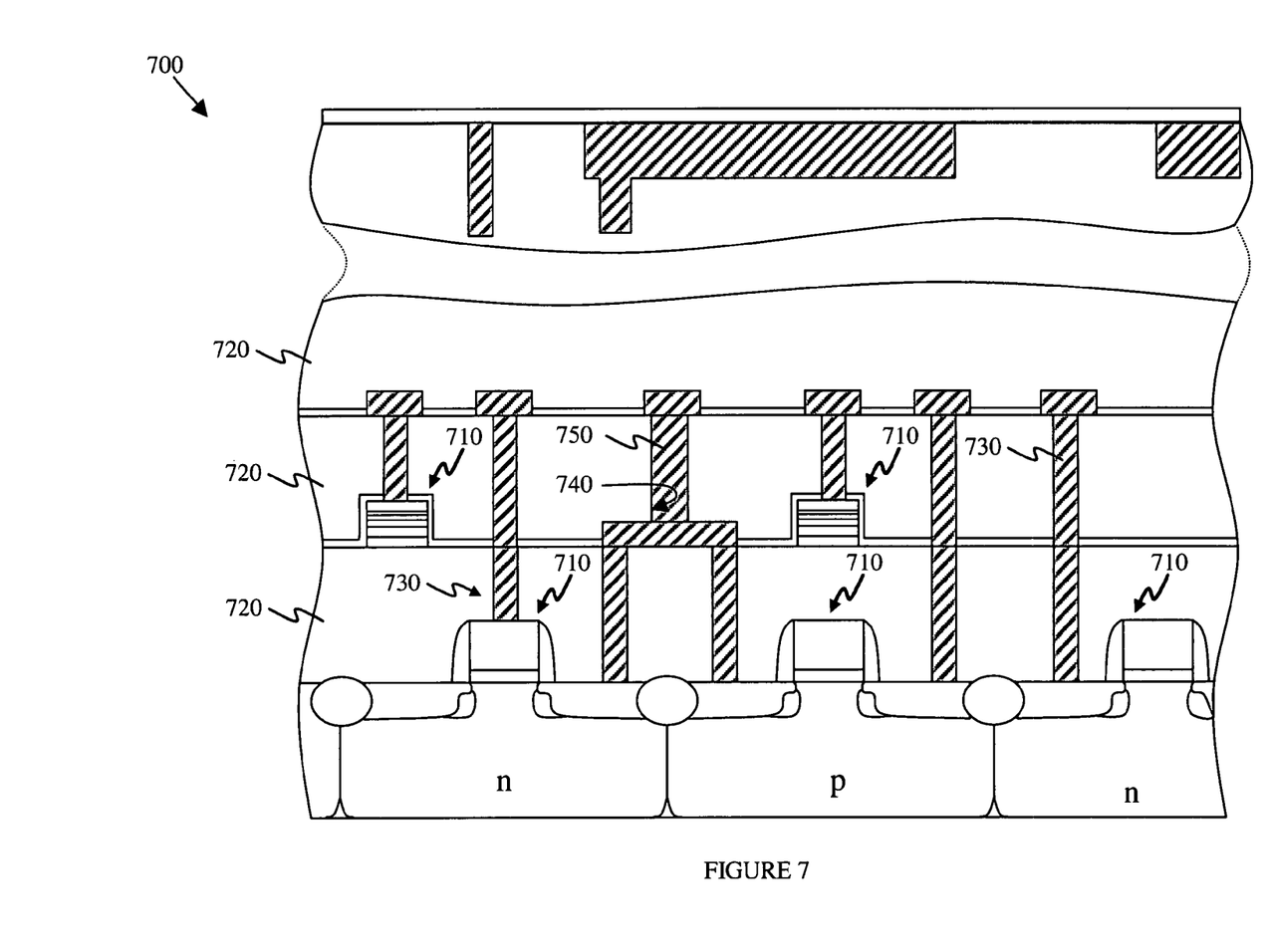
FIG. 7 illustrates a cross-sectional view of an integrated circuit (IC) incorporating semiconductor devices constructed according to the principles of the present invention.

Referring finally to FIG. 7, illustrated is a cross-sectional view of an integrated circuit (IC) 700 incorporating semiconductor devices 710 constructed according to the principles of the present invention. The IC 700 may include devices, such as transistors used to form CMOS devices, BiCMOS devices, Bipolar devices, capacitors or other types of devices. The IC 700 may further include passive devices, such as inductors or resistors, or it may also include optical devices or optoelectronic devices. Those skilled in the art are familiar with these various types of devices and their manufacture. In the particular embodiment illustrated in FIG. 7, the IC 700 includes the semiconductor devices 710 having dielectric layers 720 formed thereover. Additionally, interconnect structures 730, each including openings 740 and conductive plugs 750, are located within the dielectric layers 720 to interconnect various devices, thus, forming the operational IC 700.

Although the present invention has been described in detail, those skilled in the art should understand that they can make various changes, substitutions and alterations herein without departing from the spirit and scope of the invention in its broadest form.

What is claimed is:

1. A method for etching a substrate, comprising:
   providing a dielectric layer having an aluminum oxide etch stop layer located thereunder;
   providing a microelectronic device, the aluminum oxide etch stop layer positioned between the microelectronic device and dielectric layer; and
   etching an opening in said dielectric layer using an etchant comprising a carbon oxide, a fluorocarbon, an etch rate modulator, and an inert carrier gas, wherein a flow rate of said carbon oxide is greater than about 80 sccm and said etchant is selective to said aluminum oxide etch stop layer, and without overetching said etch stop layer into said microelectronic device and without introducing hydrogen into the method for etching the substrate.

2. The method as recited in claim 1 wherein said flow rate of said carbon oxide ranges from about 150 sccm to about 220 sccm.

3. The method as recited in claim 1 wherein said carbon oxide comprises carbon monoxide.

4. The method as recited in claim 1 wherein said etch rate modulator comprises oxygen.

5. The method as recited in claim 1 wherein said etch rate modulator comprises nitrogen.

6. The method as recited in claim 1 wherein said fluorocarbon comprises $C_5F_8$, $C_4F_8$, $C_4F_6$, $C_2F_6$, $CF_4$, $NF_3$, $XeF_2$, $F_2$, $CHF_3$, $CH_2F_2$, $CH_3F$, $SF_6$, or any combination thereof.

7. The method as recited in claim 1 wherein the method is without providing an additional barrier layer between the microelectronic device and substrate.

8. The method as recited in claim 4 wherein a ratio of said fluorocarbon to said etch rate modulator is at least 2:1.

9. The method as recited in claim 8 wherein a flow rate of said fluorocarbon ranges from about 12 sccm to about 18 sccm, and a flow rate of said etch rate modulator ranges from about 4 sccm to about 8 sccm.

10. A method for manufacturing an integrated circuit, comprising:
    providing semiconductor devices over a semiconductor substrate;
    providing a dielectric layer over said semiconductor devices, said dielectric layer having an aluminum oxide etch stop layer located thereunder and without providing an additional barrier layer between the semiconductor devices and dielectric layer; and
    etching openings in said dielectric layer using an etchant comprising a carbon oxide, a fluorocarbon, an etch rate modulator, and an inert carrier gas, wherein a flow rate of said carbon oxide is greater than about 80 sccm and said etchant is selective to said aluminum oxide etch stop layer; and
    contacting said semiconductor devices through said openings.

11. The method as recited in claim 10 wherein said flow rate of said carbon oxide ranges from about 150 sccm to about 220 sccm.

12. The method as recited in claim 10 wherein said carbon oxide comprises carbon monoxide.

13. The method as recited in claim 10 wherein said etch rate modulator comprises oxygen.

14. The method as recited in claim 10 wherein said etch rate modulator comprises nitrogen.

15. The method as recited in claim 10 wherein said fluorocarbon comprises $C_5F_8$, $C_4F_8$, $C_4F_6$, $C_2F_6$, $CF_4$, $NF_3$, $XeF_2$, $F_2$, $CHF_3$, $CH_2F_2$, $CH_3F$, $SF_6$, or any combination thereof.

16. The method as recited in claim 10 wherein at least one of said semiconductor devices is a ferroelectric capacitor.

17. The method as recited in claim 13 wherein a ratio of said fluorocarbon to said etch rate modulator is at least 2:1.

18. The method as recited in claim 17 wherein a flow rate of said fluorocarbon ranges from about 12 sccm to about 18 sccm, and a flow rate of said etch rate modulator ranges from about 4 sccm to about 8 sccm.

19. A method of manufacturing an intergrated circuit comprising:
    providing semiconductor devices over a semiconductor substrate;
    providing a dielectric layer over said semiconductor devices, said dielectric layer having an aluminum oxide etch stop layer located thereunder and without providing an additional barrier layer between the semiconductor devices and dielectric layer; and
    etching openings in said dielectric layer using an etchant comprising carbon oxide, a fluorocarbon, an etch rate modulator, and an inert carrier gas, wherein a flow rate of said carbon oxide is greater than about 80 sccm and said etchant is selective to said aluminum oxide etch stop layer; and
    contacting said semiconductor devices through said openings.

20. The method as recited in claim 19 wherein at least one of said semiconductor devices is a ferroelectric capacitor.

* * * * *